(12) United States Patent
Bell et al.

(10) Patent No.: US 7,079,064 B1
(45) Date of Patent: Jul. 18, 2006

(54) METHOD AND APPARATUS FOR PHASE CONTROL OF A DIGITAL-TO-ANALOG CONVERTER

(75) Inventors: Jeffery C. Bell, Haslet, TX (US); Pablo A. Tacconi, Arlington, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 11/235,401

(22) Filed: Sep. 26, 2005

(51) Int. Cl.
*H03M 1/66* (2006.01)

(52) U.S. Cl. .................... 341/144; 341/126; 327/91
(58) Field of Classification Search ......... 341/110–172
See application file for complete search history.

(56) References Cited

U.S. PATENT DOCUMENTS 4,833,445 A * 5/1989 Buchele ...................... 341/118
6,005,507 A * 12/1999 Nakatsu et al. ............. 341/155
6,337,650 B1 * 1/2002 Mitsutani ..................... 341/155

* cited by examiner

*Primary Examiner*—Lam T. Mai
(74) *Attorney, Agent, or Firm*—Steven A. May

(57) ABSTRACT

A digital-to-analog converter system is provided that controls a phase of an output signal produced by a digital-to-analog converter (DAC). A digital input signal and a phase control signal are each applied to the DAC. The DAC then produces an analog output signal based on the input signal and the phase control signal, wherein the analog signal comprises an output with a frequency and a phase component. The DAC further produces a phase adjustment signal that is conveyed to an auxiliary circuit that determines a phase difference between a reference signal and the phase adjustment signal and generates the phase control signal based on the phase difference, wherein a phase of the analog output signal is adjusted based on the phase control signal. By controlling the phase of an analog output signal of a DAC, DAC-to-DAC skew may be minimized.

10 Claims, 4 Drawing Sheets

METHOD AND APPARATUS FOR PHASE CONTROL OF A DIGITAL-TO-ANALOG CONVERTER

FIELD OF THE INVENTION

The present invention relates generally to digital-to-analog converters and, in particular, to controlling a phase of a signal output by a digital-to-analog converter.

BACKGROUND OF THE INVENTION

In current telecommunication systems, information is sometimes exchanged in a digital format. The digitizing of such information may produce a complex digital signal, such as a quadrature amplitude modulation signal comprising an in-phase component (I) and a quadrature component (Q), that may then be applied to multiple DACs for conversion to an analog signal. The analog signals output by each of the multiple DACs are then combined after being modulated onto a radio frequency carrier and amplified for transmission over an air interface. In order to coherently combine the outputs of the multiple DACs, the outputs of the DACs should be nearly perfectly phase aligned, that is, preferably should have a phase differential of less than four nanoseconds (ns) where the DAC component of this differential should be less than 0.5 ns.

It is well known in the art that a digital-to-analog converter (DAC) comprises a digital portion and an analog portion. Propagation of a signal through the analog portion introduces a delay, or a skew, to the propagation of the signal. Further delay is introduced by the insertion of the signal into the analog portion. In order to coherently combine the outputs of the multiple DACs, the analog path of each DAC needs to be nearly perfectly aligned. However, due to DAC component integrated circuit process variations and variations among the DACs in operating temperatures, age, and supply voltage, the delay introduced to a propagating signal varies from DAC to DAC. This delay difference among DACs, also known as a DAC-to-DAC skew, makes coherent combining difficult at best. Currently, the only method for controlling DAC-to-DAC skew is to carefully control the manufacture of DACs in order to assure that each DAC is nearly identical to all other DACs and/or to test DACs for their skew in order to identify DACs with identical skew. However, not only is this a costly and burdensome process, but this also fails to resolve phase differences that may result from variations in operating temperatures, age, and supply voltage among multiple DACs that may reside on different boards but whose outputs are being combined.

Therefore, a need exists for a method and apparatus that minimizes DAC-to-DAC skew when the DACs are employed in a non-ideal operating environment.

Figure 1:
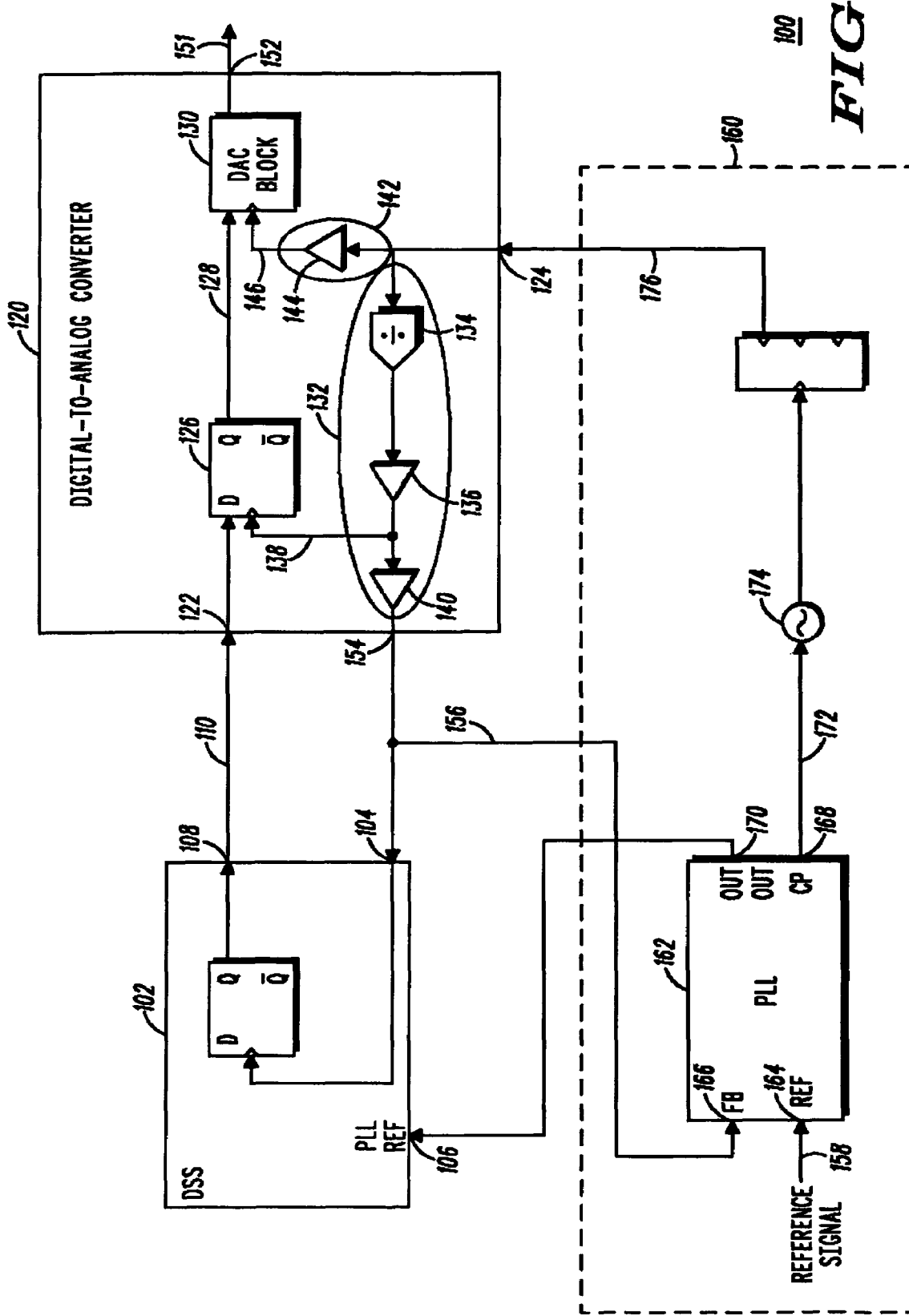
FIG. 1 is a block diagram of a digital-to-analog converter system in accordance with an embodiment of the present invention.

Skilled artisans will appreciate that elements in the figures are illustrated for simplicity and clarity and have not necessarily been drawn to scale. For example, the dimensions of some of the elements in the figures may be exaggerated relative to other elements to help improve understanding of various embodiments of the present invention. Also, common and well-understood elements that are useful or necessary in a commercially feasible embodiment are often not depicted in order to facilitate a less obstructed view of these various embodiments of the present invention.

DETAILED DESCRIPTION OF THE INVENTION

To address the need for a method and apparatus that minimizes DAC-to-DAC skew when the DACs are employed in a non-ideal operating environment, a digital-to-analog converter system is provided that controls a phase of an output signal produced by a digital-to-analog converter (DAC). A digital input signal and a phase control signal are each applied to the DAC. The DAC then produces an analog output signal based on the input signal and the phase control signal, wherein the analog signal comprises an output with a frequency and a phase component. The DAC further produces a phase adjustment signal that is conveyed to an auxiliary circuit that determines a phase difference between a reference signal and the phase adjustment signal and generates the phase control signal based on the phase difference, wherein a phase of the analog output signal is adjusted based on the phase control signal. By controlling the phase of an analog output signal of a DAC, DAC-to-DAC skew may be minimized.

Generally, an embodiment of the present invention encompasses a method for for controlling a phase of an output signal produced by a digital-to-analog converter (DAC). The method includes applying an input signal to the DAC, wherein the input signal comprises a digital signal, applying a phase control signal to the DAC, and producing, by the DAC, an analog output signal based on the input signal and the phase control signal, wherein the analog signal comprises an output with a frequency and a phase component. The method further includes producing, by the DAC, a phase adjustment signal, determining a phase difference between a reference signal and the phase adjustment signal, and generating the phase control signal based on the phase difference, wherein a phase of the analog output signal is adjusted based on the phase control signal.

Another embodiment of the present invention encompasses an apparatus for controlling a phase of a digital-to-analog converter. The apparatus includes a digital-to-analog converter (DAC) that receives an input digital signal, produces a phase adjustment signal, produces an analog output signal based on the input digital signal and the phase adjustment signal, and conveys the phase adjustment signal to an auxiliary circuit. The apparatus further includes the auxiliary circuit, coupled to the DAC, that receives the phase adjustment signal, compares the phase adjustment signal to a reference signal, produces a phase control signal based on the comparison of the phase adjustment signal to a reference signal, and conveys the phase control signal to the DAC, wherein the DAC adjusts a phase of the analog output signal based on the phase control signal.

Yet another embodiment of the present invention encompasses an apparatus for controlling digital-to-analog converter to digital-to-analog converter (DAC-to-DAC) skew. The apparatus includes a first digital-to-analog converter (DAC) that receives a first input digital signal, produces a first phase adjustment signal, conveys the phase adjustment signal to a first auxiliary circuit, and produces a first analog output signal based on the first input digital signal and a first phase control signal, and the first auxiliary circuit, coupled to the first DAC, that receives the first phase adjustment signal, compares the first phase adjustment signal to a reference signal to produce a comparison, and produces the first phase control signal based on the comparison. The apparatus further includes a second DAC that receives a second input digital signal, produces a second phase adjustment signal, conveys the second phase adjustment signal to a second auxiliary circuit, and produces a second analog output signal based on the input digital signal and a second phase control signal, and the second auxiliary circuit, coupled to the second DAC, that receives the second phase adjustment signal, compares the second phase adjustment signal to the reference signal to produce a comparison, and produces the second phase control signal based on the comparison. The apparatus further includes a combiner coupled to the first DAC and the second DAC that coherently combines the first analog output signal and second analog output signal.

The present invention may be more fully described with reference to FIGS. 1–3. FIG. 1 is a block diagram of a digital-to-analog converter (DAC) system 100 in accordance with an embodiment of the present invention. DAC system 100 includes a digital signal source (DSS) 102, for example, a Field Programmable Gate Array (FPGA), a Digital Signal Processor (DSP), or a Crest Factor Reduction (CFR) module, that sources a digital signal, such as a complex signal comprising an in-phase component (I) and a quadrature component (Q), for subsequent conversion to an analog signal. DAC system 100 further includes a DAC 120, such as an AD9779 that is commercially available from Analog Devices, Inc., of Norwood, Mass., coupled to DSS 102 and an auxiliary circuit 160 coupled to each of DSS 102 and DAC 120.

DSS 102 includes multiple input ports 104, 106 and at least one output port 108. DAC 120 includes multiple input ports 122, 124 and multiple output ports 152, 154. DAC 102 further includes a flip flop 126 that is coupled to a first input port 122 of the multiple input ports, a synchronous digital to analog converter 130 that is coupled to the flip flop 126 and to a first output port 152 of the multiple output ports, a first clock tree 132 that is coupled to each of a second input port 124 of the multiple input ports, flip flop 126, and a second output port 154 of the multiple output ports, and a second clock tree 142 that is coupled to second input port 124 and to the synchronous digital to analog converter block 130.

First clock tree 132 comprises a frequency divisor 134 that is coupled, at an input of the divisor, to second input port 124 and, at an output of the divisor, to an input of a first buffer 136. First buffer 136 is further coupled, at an output of the buffer, to a second buffer 140 and to flip flop 126. Second buffer 140 is further coupled, at an output of the buffer, to second output port 154. Second clock tree 142 comprises a third buffer 144 that is coupled, at an input of the buffer, to the second input port 124 and, at an output of the buffer, to synchronous digital to analog converter block 130.

Auxiliary circuit 160 comprises a phase lock loop (PLL) 162 coupled to a reference signal generator 174, preferably a voltage controlled oscillator (VCO). Preferably PLL 162 is coupled to reference signal generator 174 via a first output port 168, preferably a charge pump (CP) output port, of multiple PLL output ports 168, 170 and is further coupled to an input reference signal generator (not shown) via a first input port 164 of multiple PLL input ports 164, 166. PLL 162 is further coupled, via a second input port 166 of the multiple PLL input ports, to DAC 120 and, via a second output port 170 of the multiple PLL output ports, to DSS 102. PLL 162 may comprise any one of numerous commercially integrated PLL circuits, such as CDC7005 commercially available from Texas Instruments.

Auxiliary circuit 160 provides a phase control signal to DAC 120 that controls a phase of the analog signal output by the DAC, that is, analog signal 150. By controlling a phase of the signal output by DAC 120, DAC system 100 provides a DAC output signal whose phase is controllable and can be aligned with the phase of a signal output by another DAC regardless of the integrated circuit process/production lot, operating temperatures, age, and supply voltage of DAC 120. By assuring that the phases are aligned, DAC system 100 facilitates a coherent combining of the output analog signals.

Figure 2:
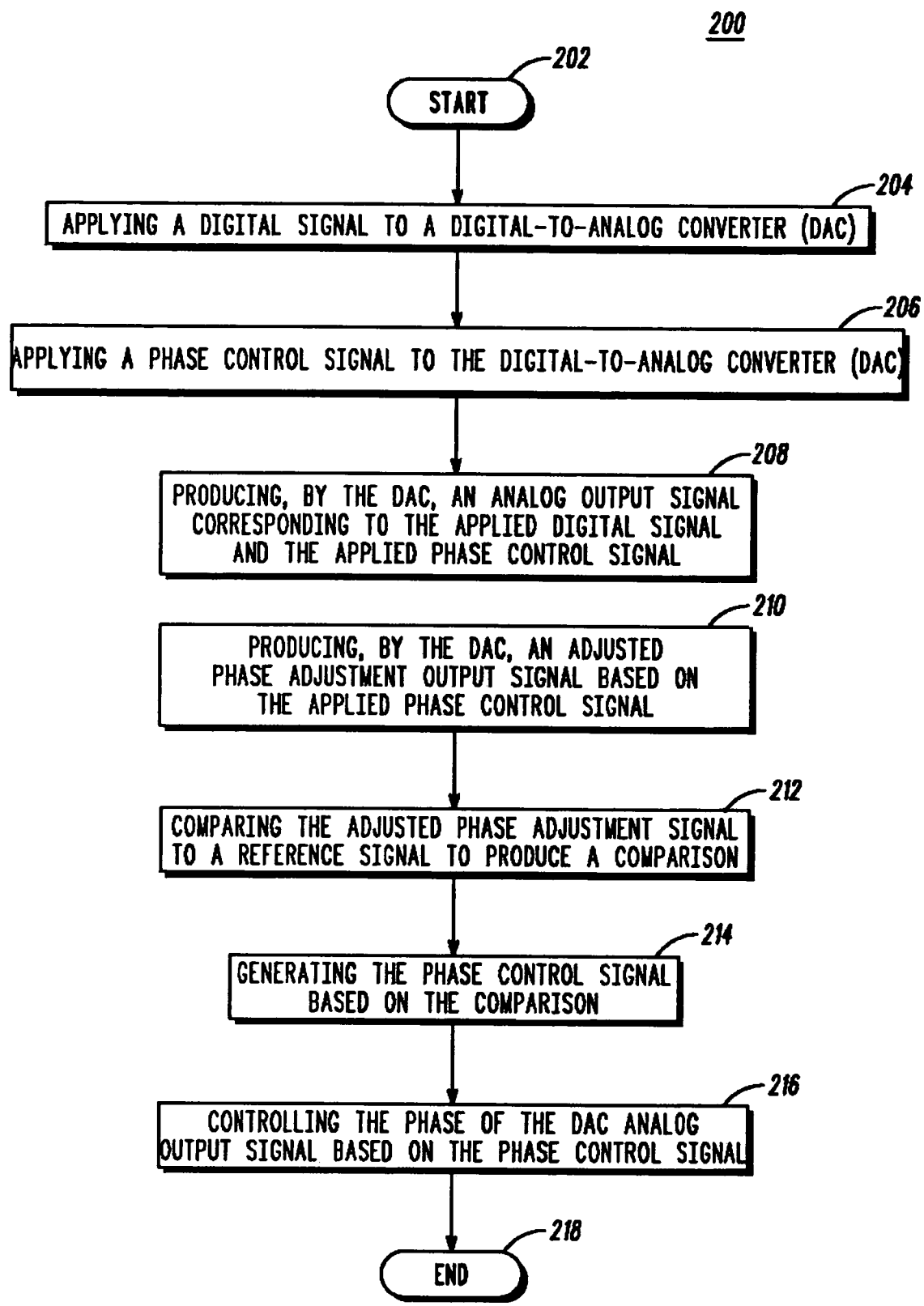
FIG. 2 is a logic flow diagram depicting a method executed by the digital-to-analog converter system of FIG. 1 in controlling a phase of an analog output signal in accordance with an embodiment of the present invention.

Referring now to FIGS. 1 and 2 an operation of DAC system 100 now described. FIG. 2 is a logic flow diagram 200 of the operation of DAC system 100 in accordance with an embodiment of the present invention. Logic flow diagram 200 begins (202) when DSS 102 generates a digital signal 110, preferably I/Q data. DSS 102 conveys digital signal 102 to DAC 120 via output port 108 of the DSS and the digital signal is applied (204) to a first input port 122 of the multiple input ports of DAC 120. Reference signal generator 174 conveys phase control signal 176 and is applied (206) to DAC 120 via the second input port 124. Based on the received digital signal 110 and phase control signal 176 received from auxiliary circuit 160, DAC 120 then produces (208) a phase-controlled output signal 150.

More particularly, in response to receiving digital signal 110, DAC 120 routes the digital signal to flip flop 126, such as a 'D' flip flop. Flip flop 126 further receives a first phase adjustment signal 138 that is produced (210) by first clock tree 132. Based on the received digital signal and first phase adjustment signal 138, flip flop 126 produces a digital value 128. Flip flop 126 conveys the digital value 128 to synchronous digital to analog converter block 130. Synchronous digital to analog converter block 130 further receives a second phase adjustment signal 146 that is produced (210) by second clock tree 142. Based on digital value 128 and second phase adjustment signal 146, synchronous digital to analog converter block 130 produces (208) an analog signal, that is, output signal 150, that comprises a value that corresponds to an analog version of digital signal 128. DAC 120 uses each of first phase adjustment signal 138 and second phase adjustment signal 146 to control a phase of output signal 150 by controlling each of flip flop 126 and synchronous digital to analog converter block 130 to which the phase adjustment signals are applied. Output signal 150 is then output by DAC 120 via a first output port 152 of the multiple DAC output ports.

Auxiliary circuit 160 generates phase control signal 176 as follows. PLL 162 receives a first reference signal 158 from the input reference signal generator via first PLL input port 164. PLL 162 further receives, via second PLL input port 166, an adjusted phase adjustment signal 156 from DAC 120, that is, from first clock tree 132, and more particularly from second buffer 140 of the first clock tree. PLL 162 then compares (212) a phase of reference signal 158 to a phase of the adjusted phase adjustment signal 156 to produce a comparison. Auxiliary circuit 160 then generates (214) phase control signal 176 based on the comparison. More particularly, based on the comparison, PLL 162 generates a voltage 172 that is conveyed to reference signal generator 174. Reference signal generator 174 generates a second reference signal whose frequency is voltage controlled. Based on a level of voltage 172, reference signal generator 174 adjusts a frequency of the second reference signal to produce (214) phase control signal 176. Reference signal generator 174 then conveys phase control signal 176 to DAC 120, and more particularly to the second input port 124 of DAC 120.

DAC 120 receives phase control signal 176 from auxiliary circuit 160 and, based on the phase control signal 176, modifies first phase adjustment signal 138 and second phase adjustment signal 146. By modifying first phase adjustment signal 138 and second phase adjustment signal 146 based on phase control signal 176, phase control signal 176 functions to control a phase of output signal 150. More particularly, DAC 120 routes phase control signal 176 to each of first clock tree 132 and second clock tree 142. Based on the received phase control signal, each of first clock tree 132 and second clock tree 142 produces a modified first phase adjustment signal 138 and a modified second phase adjustment signal 146. Each of first clock tree 132 and second clock tree 142 then conveys their respective modified phase adjustment signals 138, 146 to a respective flip flop 126 and a synchronous digital to analog converter 130, where the modified phase adjustment signals 138, 146 are respectively used to control (216) a phase of signals 128 and 150.

First clock tree 132 produces the modified first phase adjustment signal 138 as follows. First clock tree 132 routes the received phase control signal to frequency divisor 134. Frequency divisor 134 then generates the modified first phase adjustment signal 138 based on the received phase control signal. More praticularly, based on the received phase control signal, frequency divisor 134 produces one or more adjusted phase adjustment signals at frequencies that are fractionally-related to the phase control signal, for example, at one or more of the frequency of the phase control signal (corresponding to dividing by '1'), one-half the frequency of the phase control signal, one-fourth the frequency of the phase control signal, and one-eighth the frequency of the phase control signal. Frequency divisor 134 then conveys the modified first phase adjustment signal 138 to flip flop 126 via buffer 136 and conveys a further buffered version of the modified first phase adjustment signal, that is, feedback signal 156, to auxiliary circuit 160, and more particularly PLL 162, via buffers 136 and 140. Flip flop 126 then adjusts a phase of output signal 150 by adjusting a phase of signal 128 based on modified first phase adjustment signal 138. Frequency divisor 134 further conveys the further buffered version of first phase adjustment signal 138 to DSS 102 via buffers 136 and 140. Second clock tree 142 produces the modified second phase adjustment signal 146 by routing phase control signal 176 to synchronous digital to analog converter block 130 via third buffer 144. Synchronous digital to analog converter block 130 then adjusts a phase of output signal 150 based on modified second phase adjustment signal 146 as described above.

DSS 102 receives the phase adjustment signal conveyed to the DSS from DAC 120 via the first DSS input port 104 and utilizes the received signal to control a frequency and phase of digital signal 110 output by the DSS. Thus, phase control signal 176 controls a phase of output signal 150 by controlling a frequency and phase of digital signal 110 and further controlling the switching of flip flop 126 and synchronous digital to analog converter block 130. Logic flow 200 then ends (218).

Figure 3A:
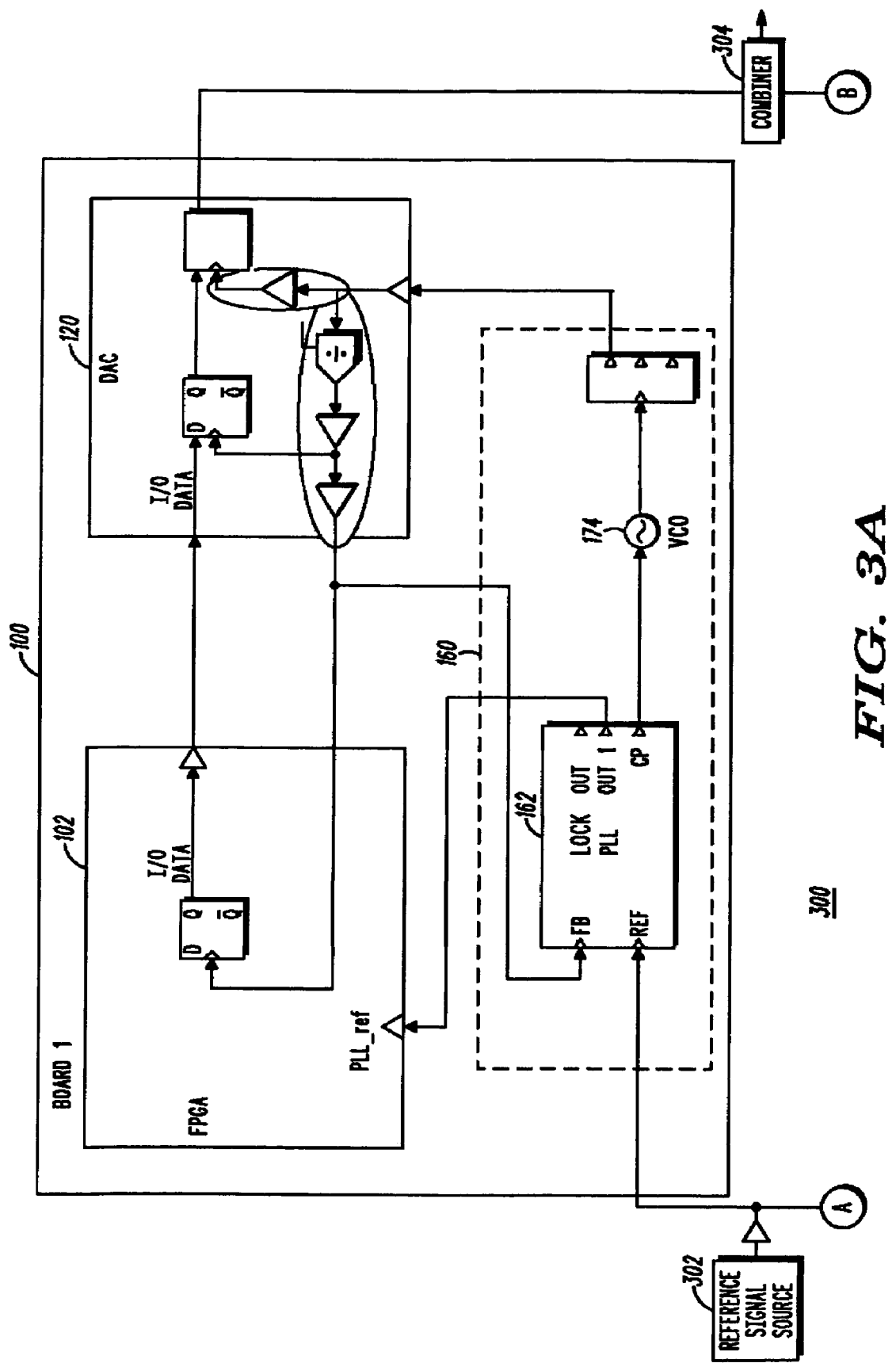
FIG. 3 is a block diagram of a digital-to-analog converter system in accordance with another embodiment of the present invention.
Figure 3B:
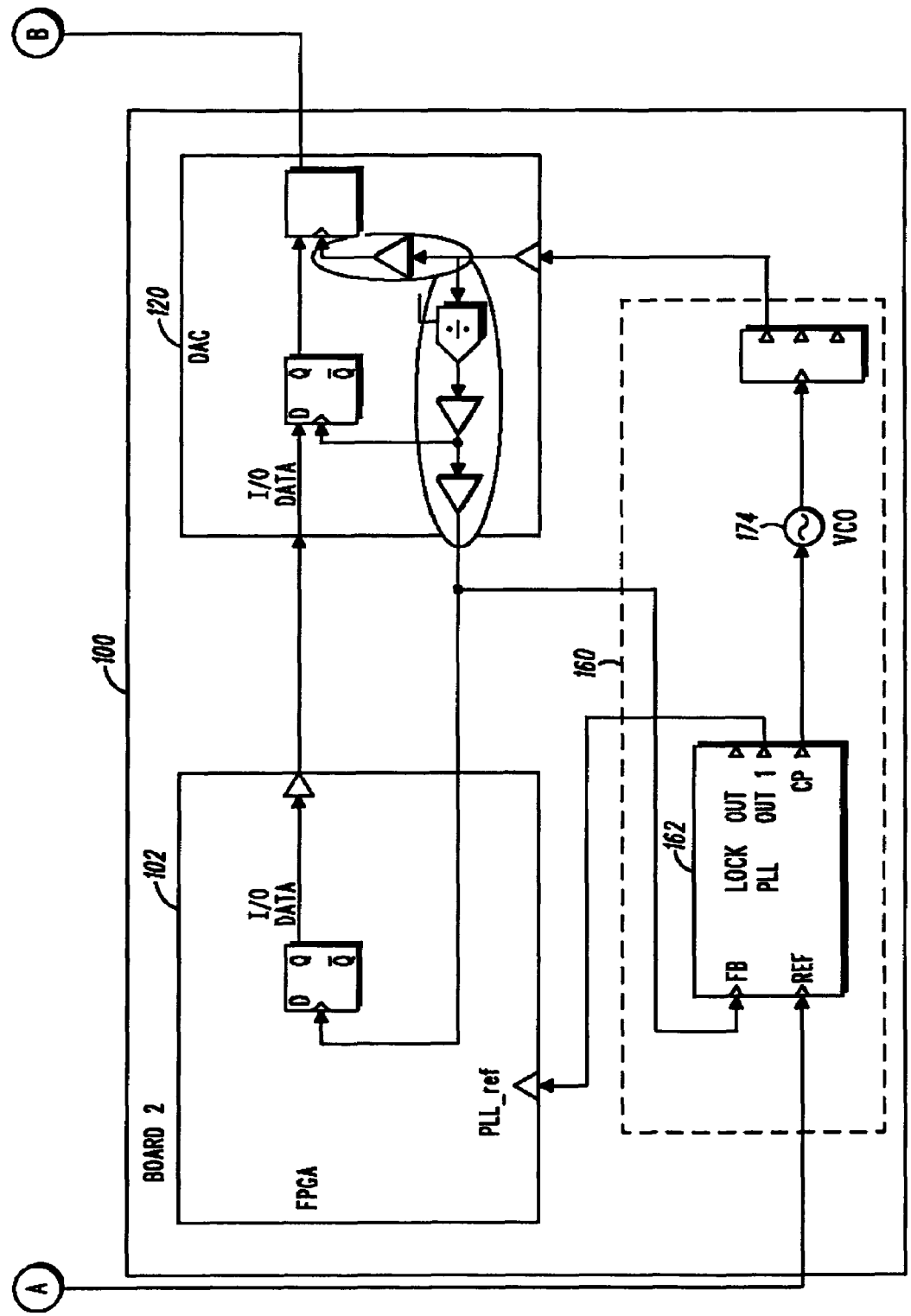

FIG. 3 is a block diagram of a multi-digital-to-analog converter (DAC) system 300 in accordance with another embodiment of the present invention. Multi-DAC system 300 comprises multiple DAC systems 100 (two shown), wherein each DAC system 100 comprises a DAC 120 and an auxiliary circuit 160 and further wherein each DAC system 100, and more particularly each DAC 120 of each DAC system, is coupled to a combiner 304 that combines the output signals 150 produced by the DAC systems. In order for the output signals of each DAC system 100 in multi-DAC system 300 to be coherently combined with the outputs of the other DAC systems 100 of multi-DAC system 300, the phases of their output signals must be aligned. Accordingly, each DAC system 100 includes an auxiliary circuit 160 that controls a phase of the analog signal output by the DAC system. Further, the auxiliary circuit 160 of each DAC system 100 utilizes a same reference signal source 302 for generation of a reference signal 158 that is compared to an adjusted phase adjustment signal 156.

By producing a phase-controlled analog output signal 150, DAC system 100 is able to compensate for delay introduced to a signal propagating through the DAC system. Thus the difference in signal propagation delays of multiple DAC systems, such as the multiple DAC systems 100 of multi-DAC system 300, which difference is known as DAC-to-DAC skew, may be compensated for and minimized regardless of component integrated circuit process variations and variations among the DAC systems in operating temperatures, age, and supply voltage. By minimizing DAC_to-DAC skew, coherent combining of the output signals of the DAC systems is facilitated.

While the present invention has been particularly shown and described with reference to particular embodiments thereof, it will be understood by those skilled in the art that various changes may be made and equivalents substituted for elements thereof without departing from the scope of the invention as set forth in the claims below. Accordingly, the specification and figures are to be regarded in an illustrative rather then a restrictive sense, and all such changes and substitutions are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any variation thereof, are intended to cover a non-exclusive inclusion, such that a process, method, article, or apparatus that comprises a list of elements does not include only those elements but may include other elements not expressly listed or inherent to such process, method, article, or apparatus. It is further understood that the use of relational terms, if any, such as first and second, top and bottom, and the like are used solely to distinguish one entity or action from another entity or action without necessarily requiring or implying any actual such relationship or order between such entities or actions.

What is claimed is:

1. A method for controlling a phase of an output signal produced by a digital-to-analog converter (DAC) comprising:

applying an input signal to the DAC, wherein the input signal comprises a digital signal;

applying a phase control signal to the DAC;

producing, by the DAC, an analog output signal based on the input signal and the phase control signal, wherein the analog signal comprises an output with a frequency and a phase component;

producing, by the DAC, a phase adjustment signal;

determining a phase difference between a reference signal and the phase adjustment signal; and generating the phase control signal based on the phase difference, wherein a phase of the analog output signal is adjusted based on the phase control signal.

2. The method of claim 1, wherein the reference signal comprises a first reference signal and wherein generating the phase control signal comprises:

generating a voltage based on the phase difference; and adjusting a frequency of a second reference signal based on the voltage to produce the phase control signal.

3. The method of claim 2, wherein adjusting a frequency of a second reference signal comprises adjusting a frequency of a signal produced by a voltage controlled oscillator based on the reference voltage.

4. The method of claim 1, wherein adjusting a phase of the output signal comprises
adjusting the phase adjustment signal based on the phase control signal; and
controlling a phase of the output signal based on the adjusted phase adjustment signal.

5. An apparatus for controlling a phase of a digital-to-analog converter comprising:
a digital-to-analog converter (DAC) that receives an input digital signal, produces a phase adjustment signal, produces an analog output signal based on the input digital signal and the phase adjustment signal, and conveys the phase adjustment signal to an auxiliary circuit; and
an auxiliary circuit coupled to the DAC that receives the phase adjustment signal, compares the phase adjustment signal to a reference signal, produces a phase control signal based on the comparison of the phase adjustment signal to a reference signal, and conveys the phase control signal to the DAC,
wherein the DAC adjusts a phase of the analog output signal based on the phase control signal.

6. The apparatus of claim 5, wherein the auxiliary circuit comprises a phase lock loop that receives the phase adjustment signal, compares the phase adjustment signal to a reference signal, and produces a voltage based on the comparison, and wherein the auxiliary circuit produces the phase control signal based on the voltage.

7. The apparatus of claim 6, wherein the auxiliary circuit further comprises a voltage controlled oscillator coupled to the phase lock loop that receives the voltage and produces the phase control signal based on the voltage.

8. The apparatus of claim 7, wherein the reference signal comprises a first reference signal and the voltage controlled oscillator produces the phase control signal by adjusting a frequency of a second reference signal based on the voltage.

9. An apparatus for controlling digital-to-analog converter to digital-to-analog converter (DAC-to-DAC) skew comprising:
a first digital-to-analog converter (DAC) that receives a first input digital signal, produces a first phase adjustment signal, conveys the phase adjustment signal to a first auxiliary circuit, and produces a first analog output signal based on the first input digital signal and a first phase control signal;
a first auxiliary circuit coupled to the first DAC, wherein the first auxiliary circuit receives the first phase adjustment signal, compares the first phase adjustment signal to a reference signal to produce a comparison, and produces the first phase control signal based on the comparison;
a second DAC that receives a second input digital signal, produces a second phase adjustment signal, conveys the second phase adjustment signal to a second auxiliary circuit, and produces a second analog output signal based on the input digital signal and a second phase control signal;
a second auxiliary circuit coupled to the second DAC, wherein the second auxiliary circuit receives the second phase adjustment signal, compares the second phase adjustment signal to the reference signal to produce a comparison, and produces the second phase control signal based on the comparison; and
a combiner coupled to the first DAC and the second DAC that coherently combines the first analog output signal and second analog output signal.

10. The apparatus of claim 9, wherein the first auxiliary circuit comprises a first phase lock loop (PLL) coupled to a first voltage controlled oscillator (VCO), wherein the first PLL receives the first phase adjustment signal, compares the first phase adjustment signal to the reference signal, and produces a first voltage based on the comparison, wherein the first VCO receives the voltage and produces the first phase control signal based on the first voltage, wherein the second auxiliary circuit comprises a second PLL coupled to a second VCO, wherein the second PLL receives the second phase adjustment signal, compares the second phase adjustment signal to the reference signal, and produces a second voltage based on the comparison, and wherein the second VCO receives the voltage and produces the second phase control signal based on the second voltage.

* * * * *